United States Patent [19]

Long et al.

[11] 4,446,505

[45] May 1, 1984

[54] ELECTRICAL CONNECTOR FOR INTERCONNECTING PRINTED CIRCUIT BOARDS

[75] Inventors: William B. Long, Camp Hill; Suel G. Shannon, Harrisburg, both of Pa.

[73] Assignee: AMP Incorporated, Harrisburg, Pa.

[21] Appl. No.: 360,503

[22] Filed: Mar. 22, 1982

[51] Int. Cl.³ .................. H01R 23/68; H01R 9/09
[52] U.S. Cl. .................. 361/413; 339/17 C; 339/17 M; 339/221 R
[58] Field of Search .......... 339/17 R, 17 C, 17 M, 339/252 P, 221 R, 221 M, 276 A; 174/68.5; 361/396, 412, 413

[56] References Cited

U.S. PATENT DOCUMENTS

| 3,333,225 | 7/1967 | McNutt .................. 339/17 |
| 3,400,358 | 9/1968 | Byrnes et al. .......... 339/17 |
| 4,076,356 | 2/1978 | Tamburro .............. 339/17 C |
| 4,186,982 | 2/1980 | Cobaugh et al. ....... 339/17 C |
| 4,186,982 | 2/1980 | Cobaugh et al. ....... 339/17 C |

FOREIGN PATENT DOCUMENTS 730762 5/1955 United Kingdom .......... 339/276 A

Primary Examiner—Eugene F. Desmond
Assistant Examiner—Steven C. Bishop
Attorney, Agent, or Firm—Adrian J. LaRue; Anton P. Ness

[57] ABSTRACT

An electrical connector in the form of a pin having spaced compliant sections for electrical connection with plated through holes in printed circuit boards. The orientation of each compliant section is such that it engages a virgin area of each plated through hole when coming to rest therein thereby forming excellent electrical and mechanical connections between the compliant sections and respective plated through holes.

5 Claims, 6 Drawing Figures

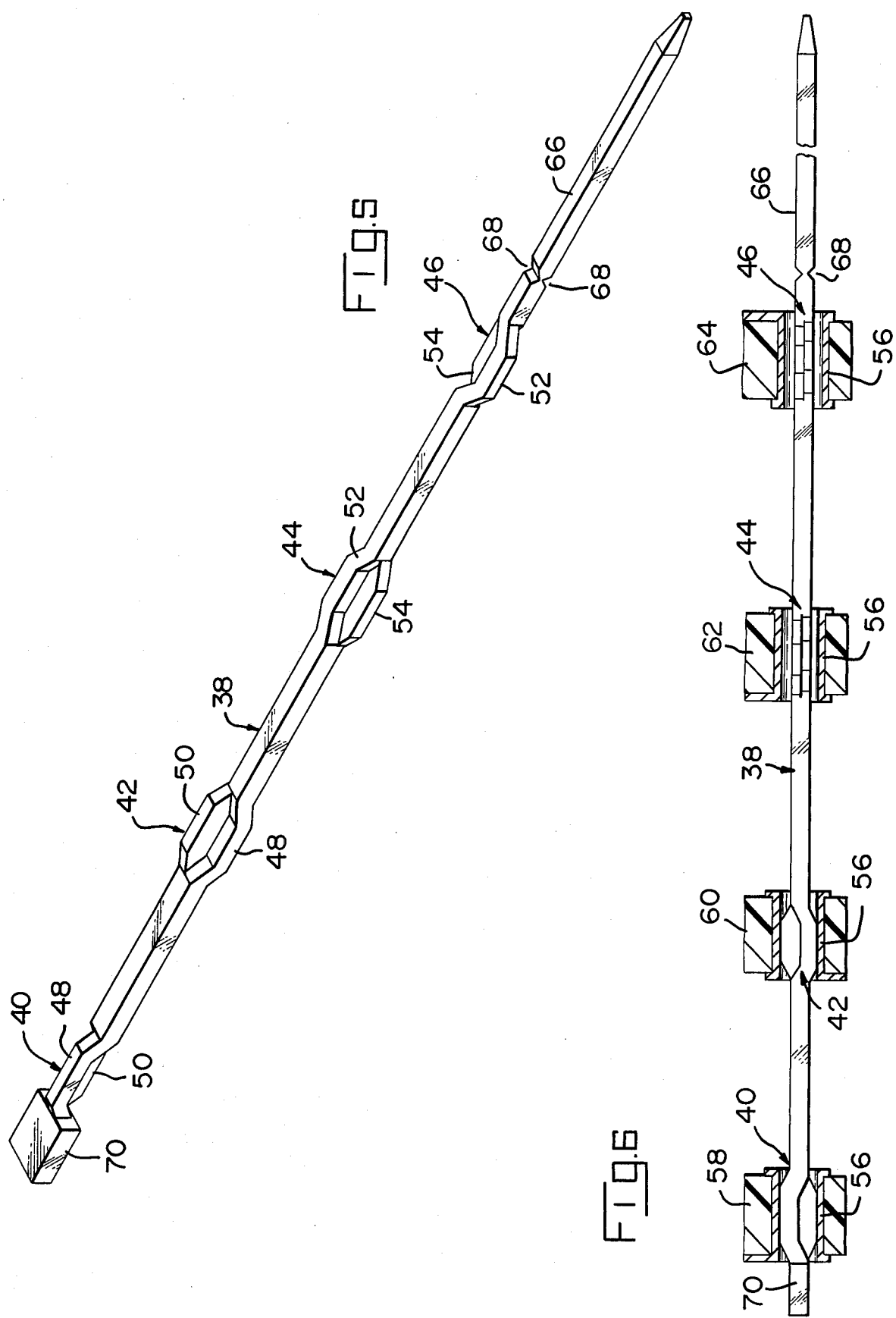

4,446,505

ELECTRICAL CONNECTOR FOR INTERCONNECTING PRINTED CIRCUIT BOARDS

FIELD OF THE INVENTION

This invention relates to electrical connectors and more particularly to an electrical connector for electrically interconnecting multiple conductive layers of printed circuit boards.

BACKGROUND OF THE INVENTION

U.S. Pat. No. 3,400,358 discloses an electrical connector having multiple bows at spaced intervals that electrically connect respectively with plated through holes in adjacent printed circuit boards electrically interconnecting the electrical circuits on the boards together. The bows of the electrical connector have the same configuration and orientation so that when the bows are inserted into the plated through holes of the adjacent printed circuit boards, the leading and following bows engage the plated through holes at the same location as they move from the upper hole to the bottom hole, the bottom hole being the only hole that receives only the leading bow therein.

This arrangement causes tracks to be formed in the plated through holes other than the bottom hole. The tracks increase the size of the contact area in the plated through holes which affect the electrical connection if the bows do not tightly engage the hole walls because of tolerance factors between the bows and the plated through holes.

SUMMARY OF THE INVENTION

The present invention is directed to an electrical connector in the form of a pin having spaced compliant sections for electrical connection with plated through holes in printed circuit boards. The orientation of each compliant section is such that it engages a virgin area of each plated through hole when coming to rest therein thereby forming excellent electrical and mechanical connections between the compliant sections and respective plated through holes.

According to another aspect of the present invention, the pin includes an extension that serves as a guide to guide the pin into the aligned plated through holes and can be used for engagement by a pulling member to pull the pin into electrical connection with the plated through holes. The extension can be broken from the pin or can serve as a post onto which wire wrap or other electrical connections can be made.

BRIEF DESCRIPTION OF THE DRAWINGS

FIG. 5 is a perspective view of an alternative embodiment of the action pin connector.

FIG. 6 is a cross-sectional view of the action pin connector of FIG. 5 electrically connected to the plated through holes of the printed circuit boards.

DETAILED DESCRIPTION OF PREFERRED EMBODIMENTS

Figure 1:
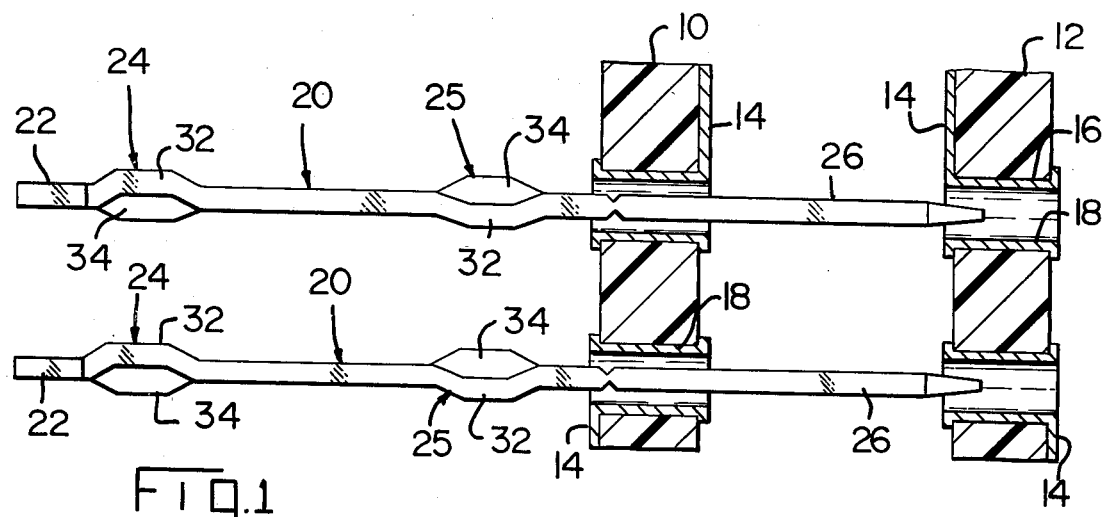
FIG. 1 is a cross-sectional view of spaced printed circuit boards with action pin connectors positioned for electrical connection therewith.
Figure 2:
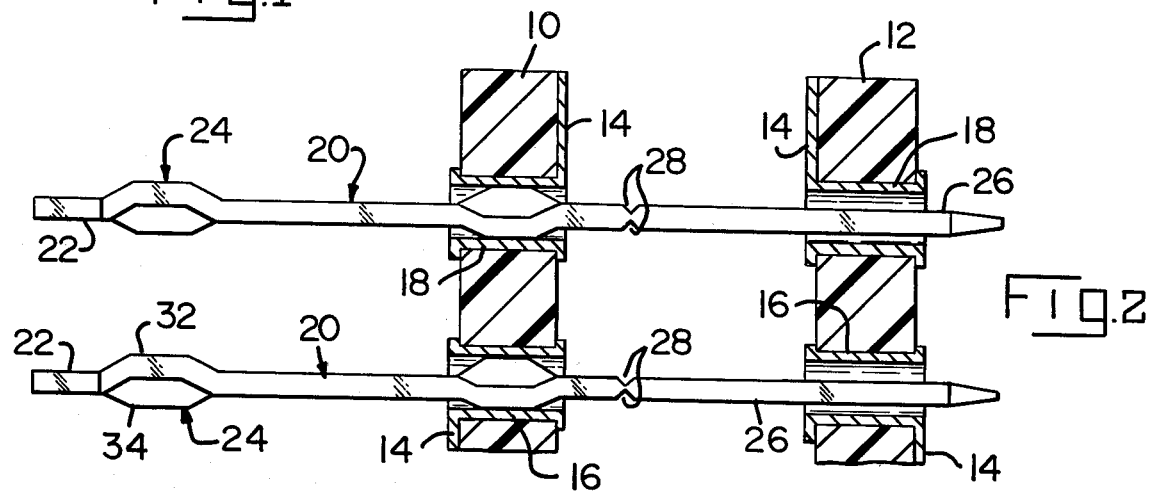
FIG. 2 is a view similar to FIG. 1 showing the action pin connectors being inserted into the plated through holes of one of the printed circuit boards.

FIGS. 1 through 4 illustrate printed circuit boards 10, 12 which are spaced from one another by being mounted in a frame member or other suitable mounting member to maintain them in spaced relationship. Boards 10, 12 can be of the multi-layer type or standard printed circuit boards on which conductive paths 14 are disposed. Each board 10, 12 has holes 16 therethrough which are aligned and are lined with metal 18 as part of conductive paths 14 and they are normally referred to as plated through holes.

Figure 3:
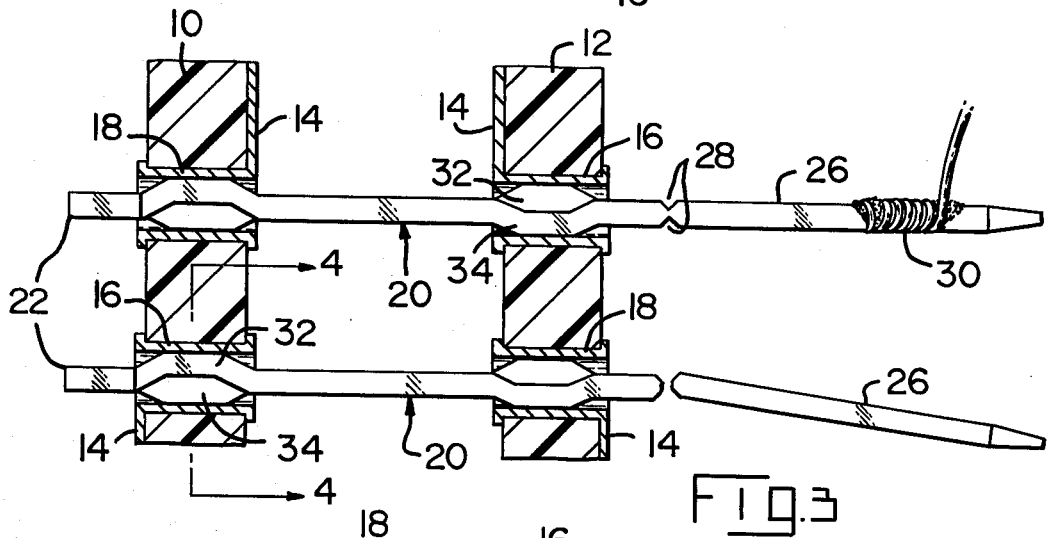
FIG. 3 is a view similar to FIG. 2 showing the action pin connectors in position in the plated through holes in the printed circuit boards.

Electrical connectors 20 are in the form of electrical pins which are formed from a suitable metal in accordance with conventional stamping practices. Each pin connector 20 includes a head section 22, contact sections 24, 25, and an extension 26. Notches 28 are formed in pins 20 to enable extension 26 to be broken off after connector pins 20 have been properly electrically connected in plated through holes 18 as illustrated in FIG. 3. Extensions 26 can also serve to have wire wrap connections 30 made thereon or other electrical connections can be made thereto. If desired, a post similar to that of extension 26 can extend outwardly from head sections 22 for making wire wrap or other electrical connections thereto. Extensions 26 also serve as guides to guide pin connectors 20 through holes 16 and can be engaged by a tool to position contact sections 24 in respective holes 16.

Figure 4:
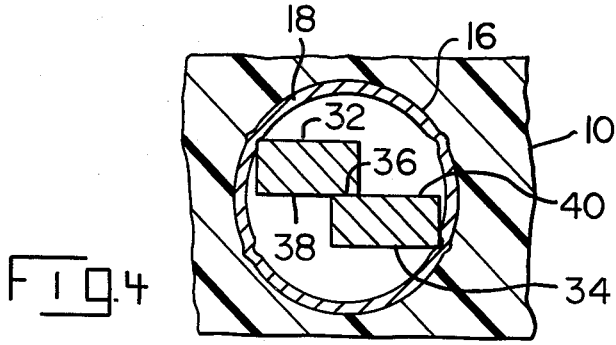
FIG. 4 is a cross-sectional view taken along line 4—4 of FIG. 3.

Contact sections 24 and 25 are of the type identified as action or compliant sections and are comprised of two legs 32, 34 which are separated from each other by means of slitting or shearing the metal along plane 36 as illustrated in FIG. 4. The legs 32, 34 are offset with respect to each other along shear plane 36 and have surfaces 38, 40 which lie in plane 36. It is to be noted that legs 32, 34 of contact section 24 are oriented in such a manner that leg 32 is directed upwardly as shown in FIG. 1 whereas leg 34 is directed downwardly whereas leg 32 in contact section 25 is directed downwardly and leg 34 is directed upwardly. Thus, the legs 32, 34 of contact sections 24, 25 are oriented in directly opposite relationship on opposite sides of shear plane 36. The reason for this is that when connector pin 20 is inserted into plated through hole 18 in printed circuit board 10, contact section 25 scores plated hole 18 therealong as contact section 25 moves therethrough but when contact section 24 becomes seated in plated through hole 18 in printed circuit board 10, legs 32, 34 of contact section 24 form new score areas along plated through hole 18 thereby not tracking in the same scores that legs 32, 34 of contact section 25 formed as they moved through plated hole 18. In this way, legs 32, 34 of contact section 24 score virgin material of plated through hole 18 thereby forming an excellent electrical and mechanical connection within plated through hole 18 in printed circuit board 10. Of course, legs 32, 34 of contact section 25 score plated through hole 18 in printed circuit board 12 thereby forming excellent mechanical and electrical connection therewith as no other contact section besides contact section 25 electrically connects therein.

Contact sections 24, 25 can be inserted and effectively retained in plated through holes in the printed circuit boards without the use of solder. Operationally, as the two legs 32, 34 are inserted into a plated through hole, the beveled edges thereof come into contact with the hole wall to produce forces between the beveled edges and the hole wall. Such forces cause the legs 32, 34 to move towards each other along the common shear plane 36, also force the legs 32, 34 towards the axis of the connector pin and, in addition, force the legs 32, 34 together in a direction normal to a plane 36. This normal force produces a frictional force between surfaces 38, 40. Upon full insertion of legs 32, 34 of contact sections 24, 25 in respective plated through holes 18, the frictional force between the facing surfaces of legs 32, 34 in addition to the spring forces caused by the compression of the legs constitute the dominant forces in retention of the connector pin within the plated through holes of the circuit boards to meet the requirements of most applications.

Thus, the forces formed between the compliant sections and the boards containing the plated through holes during positioning of the compliant sections in the plated through holes provide excellent mechanical and electrical connections without the need for solder. The connections are easily made by forces applied to head 22 or to extension 26. The connections are long-lasting and immune from vibrations or other normal forces that would cause intermittent connection or even disconnection.

Electrical connector 38 of FIG. 5 is similar in construction to that of electrical connector 20 of FIGS. 1 through 4, except that electrical connector 38 includes contact sections 40, 42, 44, and 46 with contact sections 40, 42 being normally disposed with respect to contact sections 44, 46, legs 48, 50 of contact section 40 are oriented opposite to legs 48, 50 of contact section 42, and legs 52, 54 of contact section 44 are oriented opposite to that of legs 52, 54 of contact section 46. In this way, the legs of contact sections 40, 42, 44, and 46 are electrically and mechanically connected within plated through holes 56 of printed circuit boards 58, 60, 62, and 64 in virgin areas thereof without being disposed in the tracks scored therein as contact sections 42, 44, and 46 are moved through the respective plated through holes 56 of printed circuit boards 58, 60, and 62.

Electrical connector 38 is also provided with notches 68 to enable extension 66 to be broken free thereof if desired or to be used as an extra connection area for wire wrapped connections or other connections. Extension 66 is also used as a guide to guide electrical connector 38 through the aligned plated through holes 56 and to be used by a tool for gripping thereonto to pull electrical connector 38 into position with contact sections 40, 42, 44, and 46 in position in respective plated through holes 56.

Other angular arrangements of pairs contact sections oriented opposite to one another along connector pins can be accomplished to make electrical connections with plated through holes in an optimum number of printed circuit boards.

The present invention enables electrical connections to be readily made between electrical circuits on adjacent boards that are reliable, at a reduced cost without the need for soldering.

We claim:

1. An electrical connector for electrical connection with aligned metal-lined holes in spaced printed circuit boards comprising:
   a connector pin having contact sections defining a leading and one or more following compliant contact sections;
   each of said compliant contact sections having two legs extending outwardly in opposite directions from each other along and on opposing sides of a plane associated with said each of said compliant contact sections extending through an axis of said connector;
   each of said two legs of each said compliant contact section having a contact portion for contacting a surface of a metal-lined hole of a printed circuit board;
   each of said associated planes having an orientation at an angle to others of said associated planes such that said contact portion of each of said legs is not aligned with any other of said contact portions along the axis of said connector so that when each one of said following compliant contact sections is disposed to rest within an associated metal-lined hole of a printed circuit board after said connector is inserted into a plurality of spaced printed circuit boards, each said contact portion of each of said legs makes electrical connection with a virgin area of said metal-lined hole.

2. An electrical connector for electrical connector with aligned metal-lined holes in spaced printed circuit boards comprising:
   a connector pin having contact sections defining a leading and two or more following compliant contact sections;
   each of said compliant contact sections having two legs extending outwardly in opposite directions from each other along and on opposing sides of a plane associated with said each of said compliant contact sections extending through an axis of said connector;
   each of said two legs of each said compliant contact section having a contact position for contacting a surface of a metal-lined hole of a printed circuit board;
   with respect to each one of said compliant contact sections no more than one other said compliant contact section shares an associated plane with said one of said compliant contact sections, and said two legs of said one other said compliant contact section are disposed on opposite sides of said shared associated plane reverse to the disposition of said two legs of said one of said compliant contact sections;
   each said associated plane and said shared associated plane is oriented at an angle to all others of said planes such that said contact portion of each of said legs is not aligned with any other of said contact portions along the axis of said connector so that when each one of said following compliant contact sections is disposed to rest within an associated metal-lined hole of a printed circuit board after said connector is inserted into a plurality of spaced printed circuit boards, each said contact portion of each of said legs makes electrical connection with a virgin area of said metal-lined hole.

3. An electrical connector as set forth in claim 1 wherein said connector extends forward of said leading compliant contact section defining a guide member for guiding said connector through said aligned metal-lined holes, for assisting in positioning said compliant contact sections within their associated metal-lined holes and for providing a post with which electrical connection can be made, said extension being notched adjacent said leading compliant contact section to enable said extension to be broken at said notches to free said extension from said connector.

4. An electrical connector as set forth in claim 2 wherein said connector extends forward of said leading compliant contact section defining a guide member for guiding said connector through said aligned metal-lined holes, for assisting in positioning said compliant contact sections within their associated metal-lined holes and for providing a post with which electrical connection can be made, said extension being notched adjacent said leading compliant contact section to enable said extension to be broken at said notches to free said extension from said connector.

5. An electrical connection comprising:
a plurality of spaced printed circuit boards having aligned metal-lined holes therethrough;
an electrical connector in the form of a pin having a plurality of spaced compliant contact sections defining a leading and one or more following compliant contact sections, each of said compliant contact sections having two legs extending outwardly in opposite directions from each other along and on opposing sides of a plane associated with said each of said compliant contact sections extending through an axis of said connector, each of said two legs of each said compliant contact section having a contact position for contacting a surface of a said metal-lined hole of a said printed circuit board, with respect to each one of said compliant contact sections no more than one other said compliant contact section shares an associated plane with said one of said compliant contact sections, and said two legs of said one other said compliant contact section are disposed on opposite sides of said shared associated plane reverse to the disposition of said two legs of said one of said compliant contact sections, each said associated plane and said shared associated plane is oriented at an angle to all others of said planes such that said contact portion of each of said legs is not aligned with any other of said contact portions along the axis of said connector so that when each one of said following compliant contact sections is disposed to rest within an associated said metal-lined hole of a said printed circuit board after said connector is inserted into said plurality of spaced printed circuit boards each said contact portion of each of said legs makes electrical connection with a virgin area of said metal-lined hole.

* * * * *